United States Patent [19]

Heimer

[11] 4,241,389
[45] Dec. 23, 1980

[54] MULTIPLE APPARENT SOURCE OPTICAL IMAGING SYSTEM

[75] Inventor: Richard J. Heimer, Encino, Calif.

[73] Assignee: Kasper Instruments, Inc., Sunnyvale, Calif.

[21] Appl. No.: 33,193

[22] Filed: Apr. 25, 1979

Related U.S. Application Data

[63] Continuation of Ser. No. 798,113, May 18, 1977, abandoned.

[51] Int. Cl.[3] ............................................. F21V 7/09
[52] U.S. Cl. ................................... 362/297; 362/331; 362/346
[58] Field of Search ........ 362/297, 328, 331, 346–348, 362/350

[56] References Cited

U.S. PATENT DOCUMENTS

| | | | |
|---|---|---|---|
| 2,378,677 | 6/1945 | Anderson | 362/346 X |
| 2,513,961 | 7/1950 | Ostrom | 362/346 X |
| 2,913,570 | 11/1959 | Gough et al. | 362/346 X |
| 2,968,033 | 1/1961 | Krietzberg | 362/346 X |
| 3,174,397 | 3/1965 | Sandborn | 362/346 X |
| 3,532,424 | 10/1970 | Miles | 362/346 X |
| 3,826,913 | 7/1974 | Downing et al. | 362/348 |
| 4,035,631 | 7/1977 | Day, Jr. | 362/297 |

*Primary Examiner*—Peter A. Nelson
*Attorney, Agent, or Firm*—Roland I. Griffin

[57] ABSTRACT

A multiple apparent source optical imaging system is provided having a paraboloidal assembly of plane mirrors uniformly distributed in a ring about an anisotropic light source. The assembly compensates for source anisotropy and for diffraction effects by providing uniform distribution of light, as if the light originated from multiple apparent sources uniformly distributed in a selected annular fashion in a common apparent source plane. The assembly also includes a variable focus projection lens which, in conjunction with a selected source beam divergence angle, serves to minimize linewidth error when objects, such as a mask and a semiconductor substrate, with a finite separation are illuminated. Substantially no loss in image intensity is occasioned by the system.

2 Claims, 8 Drawing Figures

MULTIPLE APPARENT SOURCE OPTICAL IMAGING SYSTEM

This is a continuation of application Ser. No. 798,113, filed May 18, 1977 and now abandoned.

BACKGROUND OF THE INVENTION

This invention relates generally to the manufacture of semiconductor devices and, in particular, to photolithographic contact and proximity printing of semiconductor microstructures.

Typically, semiconductor microstructures containing a repetitive pattern of device geometries are printed onto prepared substrates such as silicon wafer substrates. Generally, the substrate is partly covered by a mask and the mask-substrate combination is transilluminated by light radiation from an optical lens system. In proximity printing, the mask is positioned a finite distance from the substrate. In contact printing, the mask is placed directly in contact with the substrate. Often in contact printing, because of irregularities in certain areas of the surface of the substrate, the mask does not make contact with all areas of the substrate, and a gap or separation is produced between the mask and substrate at the "out-of-contact" areas. Whether this separation is intended as in the case of proximity printing or unintended as in the case of contact printing, such a separation often produces unwanted line-width errors (i.e., errors in the size and boundaries or edges of the images transferred to the substrate) due to Fresnel or near-field diffraction of light and to source anisotropy (i.e., non-uniformity in quanta or intensity distribution of light over the surface of the light source).

For purposes of producing well-defined, good-resolution, accurately-sized, accurately-shaped microstructure images when performing contact or proximity printing, it is essential that light from the optical lens system be applied uniformly over the exposed (unmasked) portions of the substrate and that diffraction be compensated for without sacrificing image intensity. However, present methods, such as the exposure variation and multiple source synthesis technique described, for example, in the article entitled Young's Interference Fringes by M. V. Klein, appearing at pages 186–189 of the book Optics, published by Wiley and Sons, Inc., New York, 1970, and in British Pat. No. 1,353,739 issued May 22, 1974, to John Kenneth Houston, either limit the intensity of the light upon the substrate or limit the uniformity of light upon the substrate (i.e., sacrifice intensity for uniformity or vice-versa). Generally, as the light source becomes more anisotropic or as the separation of mask and substrate becomes greater, the more pronounced this sacrifice becomes. In many prior art systems, not only is intensity sacrificed in favor of uniformity as a result of the use of source beam divergence (or beam pick-up) angles that are too small and the inability of the system to adequately utilize a significant portion of the doughnut shaped or toroidal source irradiance distribution, but, often, the system is limited to fixed beam-divergence angular values.

What is needed, therefore, is an optical lens system that is capable of providing uniformity in the distribution of light upon a surface, such as an exposed (unmasked) surface of a semiconductor substrate, and of producing good quality images with minimal line-width errors, all without substantial sacrifice of image intensity. The system should not be limited to fixed beam-divergence angular values, should be capable of large source beam divergence (or beam pick-up) angles (e.g., about twenty degrees), should be capable of utilizing a significant portion of the toroidal source irradiance distribution, and should not be unnecessarily limited by source anisotropy or by the distance of the mask from the semiconductor surface.

SUMMARY OF THE INVENTION

Thus, in accordance with the illustrated preferred embodiment of the present invention, a multiple apparent source optical imaging system is provided having a paraboloidal assembly of plane mirrors uniformly distributed in a ring about an anisotropic light source for providing uniformity in the distribution of light upon a surface such as an unmasked surface of a semiconductor substrate. Light from the light source is picked-up (at a large source beam divergence angle of approximately twenty degrees) uniformly across the surfaces of the mirrors and reflected toward the adjacent surfaces of the mask and the substrate in a uniformly distributed manner, as if the light originated from multiple apparent sources uniformly distributed in a selected annular fashion in a common apparent source plane. This uniform distribution, together with the large source beam divergence (or beam pick-up) angle, compensates or corrects for source anisotropy and for diffraction effects without substantial sacrifice or loss of image intensity. The uniformly distributed light seemingly originates from the apparent sources at a large source beam divergence half-angle of approximately ten degrees.

In addition to a condenser lens, a light baffle, a field lens, and selected collimating lenses, the system includes a variable focus projection lens which, together with an output beam divergence half-angle of up to approximately three degrees, serves to minimize line-width error for different mask-substrate separations. The angle at which the uniformly distributed light radiation is incident upon the adjacent surfaces of the mask and the substrate is determined by the source beam divergence angle and by the magnification ratio of the variable focus projection lens. This serves to provide the system with a variable (non-fixed) beam divergence capability for optimizing output beam divergence and minimizing line-width error.

DESCRIPTION OF THE PREFERRED EMBODIMENT

Figure 1:
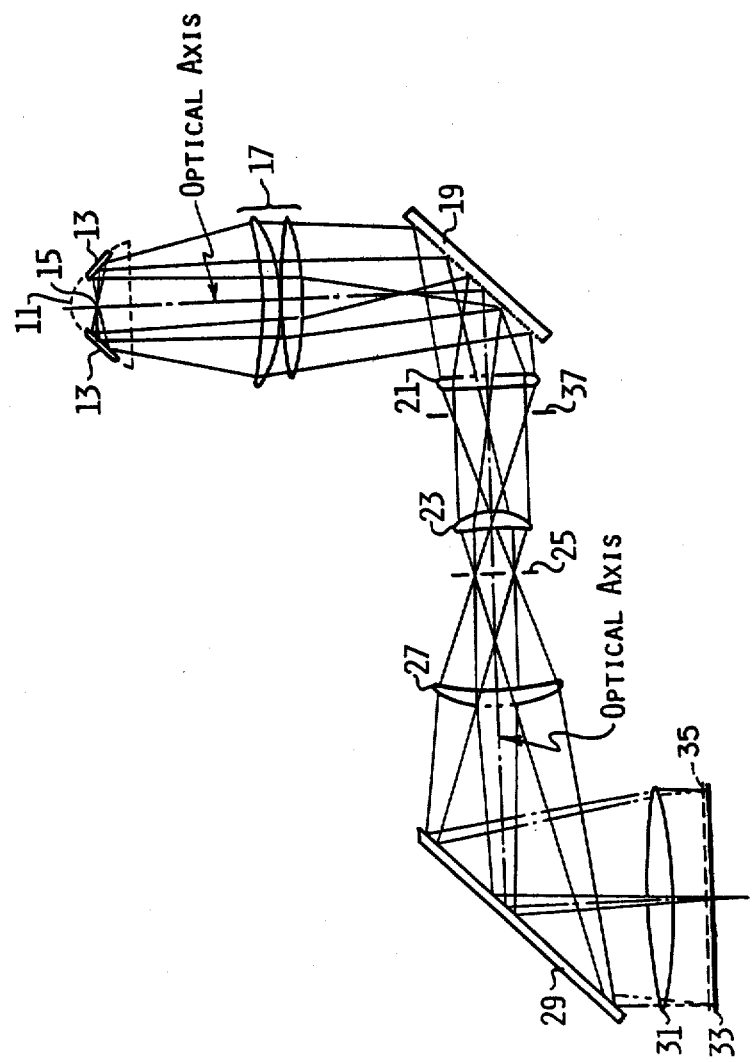
FIG. 1 is a sectional view of a multiple apparent source optical imaging system according to the present invention.

Referring now to FIG. 1 of the drawings, there is shown a multiple apparent-source optical imaging system according to the present invention. The system includes a paraboloidal plane mirror assembly 11 comprising a plurality (e.g., eight) of plane mirrors 13 uniformly distributed about the optical axis of the system and about a light source 15 such as a mercury arc lamp. The plane mirrors 13 are coated with "cold mirror" dielectrics which serve to separate near-ultraviolet light (3500 Å–4500 Å) from heat radiation (6000 Å–12000 Å) and from infrared radiation beyond twelve thousand angstroms (12000 Å), directing the former forward along the optical axis of the system. The system also includes a collimating field lens assembly 17, a reflecting plane mirror 19 (also coated with "cold mirror" dielectrics) oriented at a predetermined angle (e.g., forty five degrees), a condenser lens 21, a variable focus projection lens 23, a light baffle 25, a field lens 27, a reflecting plane mirror 29 (also coated with "cold mirror" dielectrics) oriented at a predetermined angle (e.g., forty five degrees), and a collimating lens 31.

The system operates to uniformly distribute light from light source 15 onto an object such as a semiconductor substrate or wafer 33 having masked and unmasked (i.e., exposed or apertured by a mask 35) portions of photoresist material. The system distributes the light uniformly onto the substrate, as if the light originated from multiple, uniformly distributed, apparent (visual image) sources, and produces at the exposed portion of the substrate a highly accurate, good resolution image of a required intensity. The boundaries or edges of the image accurately match the borders of the corresponding mask aperture resulting in minimal or negligible line-width errors (image size or boundary errors).

Figure 2:
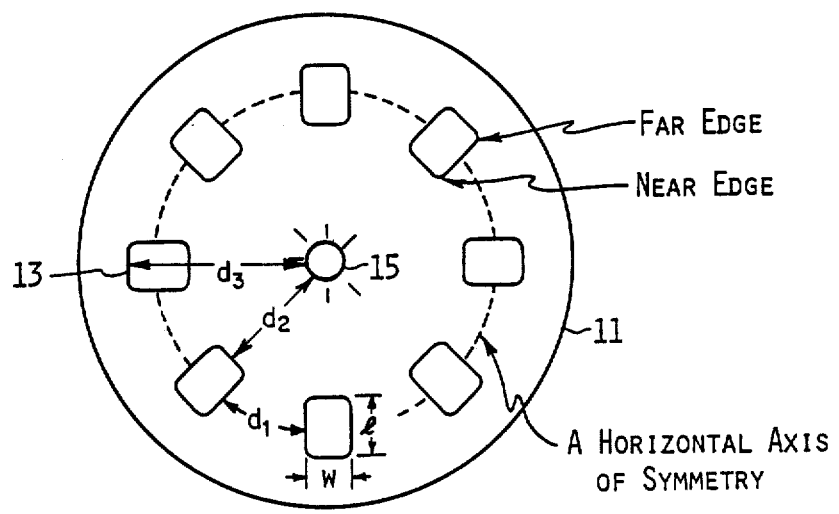
FIG. 2 is a bottom view of a paraboloidal plane mirror assembly employed in the optical imaging system of FIG. 1.
Figure 3:
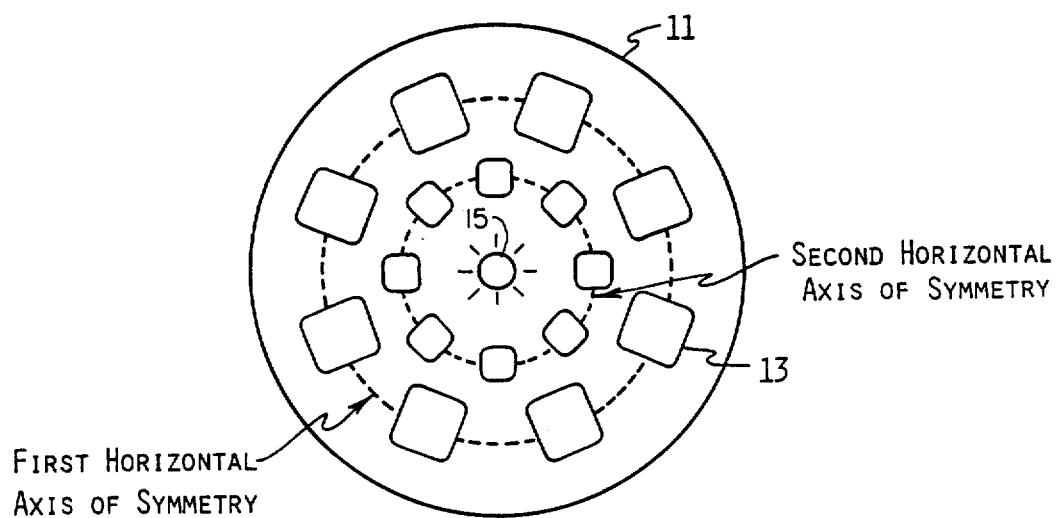
FIG. 3 is a bottom view of a mirror assembly like that of FIG. 2, but including two annular groups of mirrors.

FIG. 2 of the drawings shows a bottom view of mirror assembly 11. This assembly 11, which is paraboloidal in shape as shown in FIG. 1, includes eight plane-faceted mirrors tangentially affixed to (e.g., spring-retained in recesses of) the curved wall of the assembly 11. The mirrors are of equal size and shape and are equidistant from each other and from the light source) i.e., they have the same length (l), width (w), proximity ($d_1$), and angular distance from the light source where the angular distance is determined by the distance $d_2$ of the near edge of the mirror from the light source and the distance $d_3$ of the far edge of the mirror from the light source). The mirrors 13 form a ring encircling the light source 15 for aberration-free collection of source irradiance, the ring representing the edge or circumferential boundary of a horizontal plane in which lie the horizontal axes of symmetry of the individual mirrors 13 of the paraboloidal assembly 11. The light source 15 is positioned at the intersection of the optical axis of the system and the horizontal axis of symmetry of a selected mirror, such that the horizontal axis of the light source becomes coincident with (in the same plane as) the horizontal axis of symmetry of the selected mirror and oriented at ninety degrees with respect to the optical axis of the system. A mirror assembly 11 may have more than one group of mirrors 13 (for example, two groups of mirrors as shown in the alternative embodiment depicted in FIG. 3), in which event the horizontal axis of the light source may be located in (coincident with) the horizontal symmetry axis plane of a selected one of the groups of mirrors or located a selected distance from and parallel to that plane.

Figure 4:
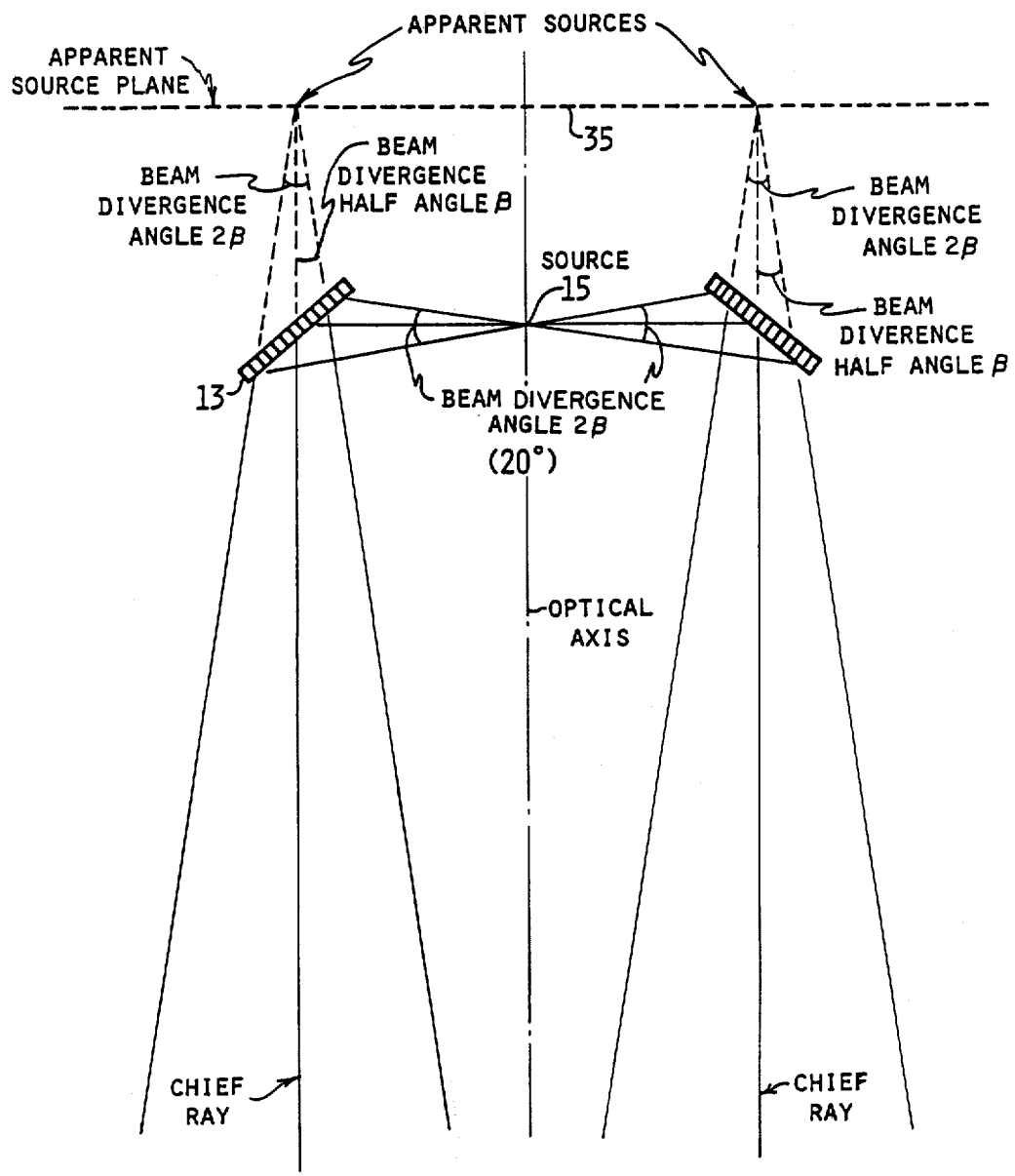
FIG. 4 is a graphic illustration of selected mirrors in the mirror assembly of FIG. 2 showing virtual image projections of apparent light sources into a common apparent source plane.

As shown in FIG. 4, the plane facet or face of each mirror 13 has a minimum source beam divergence (or beam pick-up) angle $2\beta$ (solid angle or cone) of twenty degrees. When the solid angle of light picked-up by each mirror is multiplied by the number of mirrors in the group encircling the light source, the beam pick-up angle of the system increases from that of a cone to that of a donut-shaped solid angle (the greater the beam pick-up angle, the greater the resultant image intensity, and the greater the size and number of the mirrors, the greater the beam pick-up angle).

Figure 5:
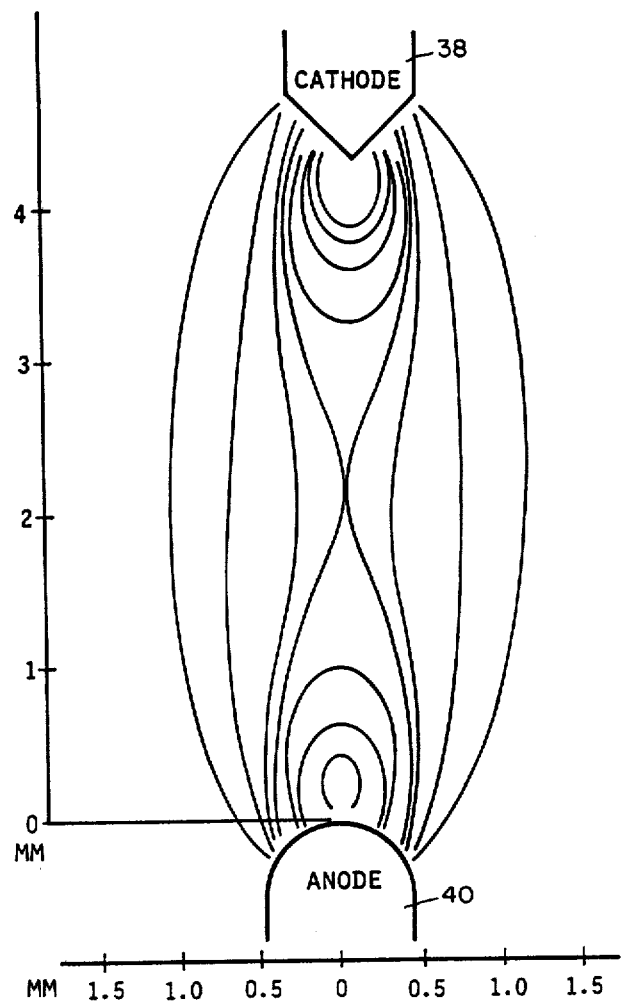
FIG. 5 is a graphic illustration of an anisotropic light source employed in the optical imaging system of FIG. 1.

Light rays picked-up by mirror 13 from light source 15 are reflected toward a collimating field lens assembly 17 (FIG. 1) at a source beam divergence angle $2\beta$ of approximately twenty degrees and centered on a chief ray which is approximately telecentric. The light from light source 15 is reflected by the mirrors 13 as if it originated from apparent sources (virtual-image sources) uniformly distributed in an apparent source plane (virtual-image source plane) 35. The geometric arrangement of mirrors 13 in the paraboloidal assembly 11 (FIG. 1) corrects for source anisotropy (i.e., non-uniformity in the distribution of light intensities from the light source, as shown, for example, in FIG. 5 by the non-uniform distribution of the light-intensity lines between the cathode 38 and the anode 40 of a typical mercury arc lamp) and provides for uniform distribution of light from a single anisotropic light source as if the single anisotropic light source were, instead, rings of multiple, isotropic light sources, uniformly distributed in the apparent source plane.

As shown in FIG. 1, light rays, including divergent and diffracted ones, from mirrors 13 are reflected onto collimating field lens assembly 17 for collimation, with the resulting individual collimated beams being reflected from mirror 19 and filling a common exit pupil (i.e., occupying a common imaginary circular planar space) located at condenser lens 21. A shutter, located at aperture stop plane 37, operates to pass light from condenser lens 21 to variable focus projection lens 23. The light relayed into the aperture stop plane 37 has a uniform angular distribution. Projection lens 23 and field lens 27 operate in unison to relay, via plane mirror 29 and collimating lens 31, the collimated beams from the exit pupil located at condenser lens 21 onto the masked substrate 33. Projection lens 23 is a variable focus projection lens subsystem, comprising a group of lenses arranged such that their separations (distances between the lenses) are variable, thereby permitting the focal length of the group to be variable and providing the optical imaging system with a variable beam divergence capability of from one to three degrees (per output beam divergence half-angle $\alpha$) in the mask-substrate plane (i.e., the plane where the bottom surface of the mask 35 and the top surface of the substrate 33 come into contact, or a plane located midway between those bottom and top surfaces in the case of proximity printing). It is understood that, rather than having a variable focus, the projection lens 23 may alternatively comprise a single lens with a fixed focal point and, hence, a fixed focus, thereby providing the optical imaging system with a fixed beam divergence in the mask-substrate plane. Projection lens 23 is positioned a distance equal to its focal length away from the condenser lens 21, thereby creating a telecentric space where the geometry of the apparent sources is imaged into an imaginary intermediate plane, appears demagnified (reduced in scale), and is oriented normal to the optical axis.

Figure 6:
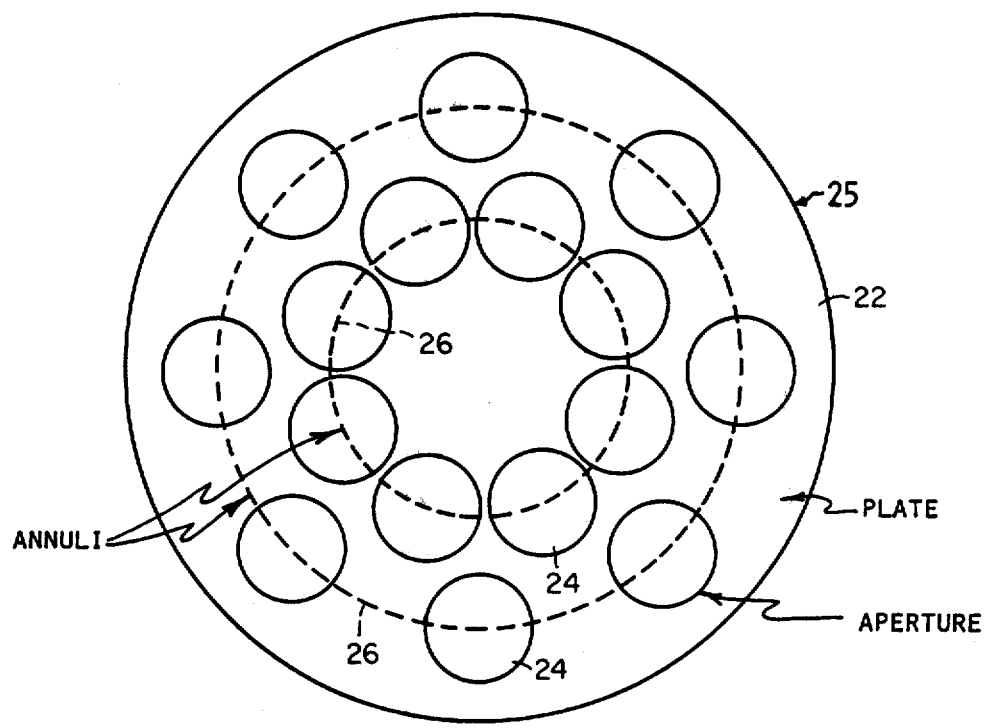
FIG. 6 is a front view of a light baffle employed in the optical imaging system of FIG. 1.

Light baffle 25 (FIG. 6), which is positioned in this imaginary intermediate plane, serves to reduce internal light scatter within the system (i.e., back scatter from multiple internal unwanted reflections) and to eliminate unwanted stray light which would otherwise reach the masked substrate 33. As shown in FIG. 6, light baffle 25 comprises a plate 22 having a selected series of apertures 24 located on annuli or rings 26 concentric with the optical axis of the system, the locations of the apertures corresponding to the image positions of the apparent light sources.

Returning now to FIG. 1, light rays from field lens 27 are reflected onto collimating lens 31 from reflecting plane mirror 29. Field lens 27 and collimating lens 31, operating in unison in telephoto fashion, uniformly transilluminate the masked substrate 33 by projecting the imaginary intermediate image plane to infinity (i.e., focusing the imaginary intermediate image plane at infinity).

Figure 7:
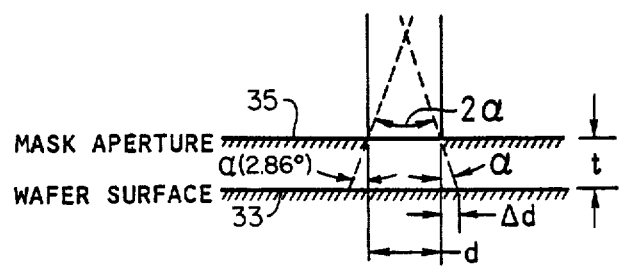
FIG. 7 is a graphic illustration of a mask and a substrate illuminated at a selected output beam divergence angle by the optical imaging system of FIG. 1.

As shown in FIG. 7, light incident upon an exposed portion of the masked substrate 33 at an output beam divergence angle $2\alpha$ produces a line-width error of $\Delta d$ at each edge of the corresponding mask aperture. The line-width error may be determined from the relationship $\tan \alpha = (\Delta d/t)$ where $\alpha$ represents the output beam divergence half-angle (the output beam divergence angle $2\alpha$ being the angular subtend of the light source in the mask-substrate plane), and t represents the separation or distance between the mask 35 and the substrate 33.

Figure 8:
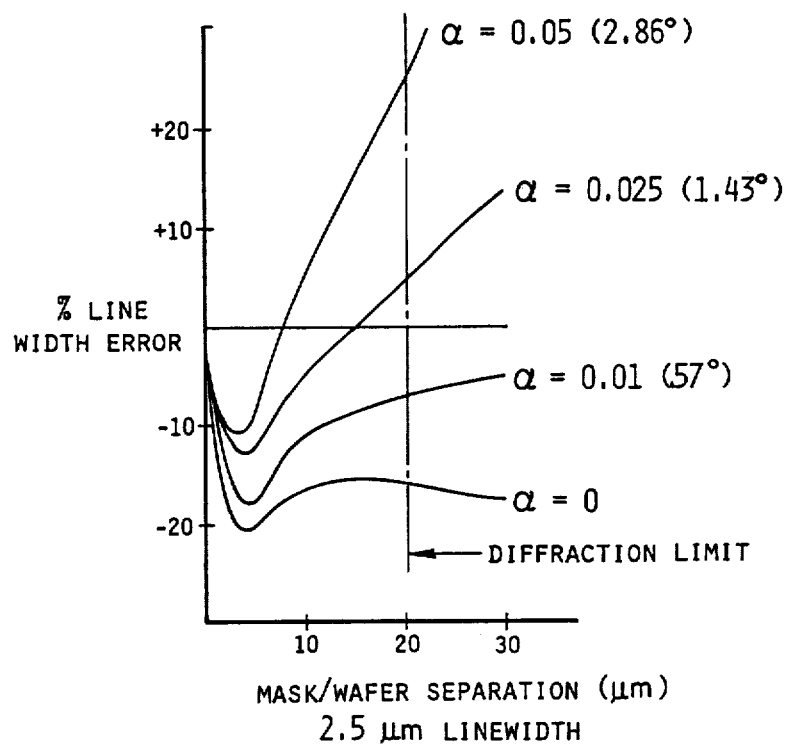
FIG. 8 is a graphic illustration of line-width error produced by the optical imaging system of FIG. 1 for selected output beam divergence angles.

Obviously, for a given output beam divergence angle $2\alpha$, the line-width error $\Delta d$ (at one edge of the mask aperture) increases as the separation t increases. Diffraction directly influences the distribution of light in the transferred image defined by the mask 35 and, hence, influences the line-width error in the image. FIG. 8 shows the effects of various output beam divergence half-angle values $\alpha$ (expressed as their angular subtend in the mask-substrate plane) upon line-width error (diffracted image blur, expressed in percentages) for different mask-wafer separations when producing an image having a line width of 2.5 micrometers ($\mu$m). The positive (+) percentage figures in FIG. 8 represent errors that make the image larger in size than it should be (i.e., additive errors), and the negative (−) percentage figures represent errors that make the image smaller in size than it should be (i.e., subtractive errors).

Thus, as shown in FIG. 8, by utilizing an output beam divergence half-angle $\alpha$ of 2.86° the system of the present invention produces a smaller percentage of error for mark-substrate separations of about 12 $\mu$m or less than prior art systems which typically utilize a smaller output beam divergence half angle (e.g., an output beam divergence half-angle $\alpha$ of about 0.57° as shown in FIG. 8). However, unlike typical prior art systems, the system of the present invention (when utilizing an output beam divergence half-angle $\alpha$ of such a magnitude, 2.86°, that approaches three degrees) does not sacrifice image intensity, by limiting the source beam divergence (or beam pick-up) angle $2\beta$, as do prior art systems. The system of the present invention permits the use of an output beam divergence half-angle $\alpha$ of approximately three degrees while permitting a source beam divergence (or beam pick-up) angle $2\beta$ as large as twenty degrees. Thus, the output beam divergence half angle $\alpha$ in the system of the present invention can be increased (typically from about two to approximately three degrees) to better compensate (i.e., to compensate to a greater degree than the prior art) for diffraction effects, without sacrificing the source beam divergence (or beam pick-up) angle $2\beta$ and, hence, image intensity.

The angle of incidence of the radiation at the mask-substrate plane is determined by the source beam divergence (or beam pick-up) angle $2\beta$ and by the magnification ratio of the variable focus projection lens 23 (FIG. 1). By means of this variable focus capability, therefore, an optimum output beam divergence half angle $\alpha$ may be selected, for a given line-width d and a predetermined tolerable mask-substrate separation t, to compensate for diffraction effects and minimize line-width error $\Delta d$.

Often, prior art systems which are designed to produce an output beam divergence half-angle in excess of two degrees, exhibit narrow source beam divergence (or beam pick-up) angles and are limited to utilizing only small portions of the toroidal source distribution. This reduces the amount of light radiation applied to the mask and substrate, thereby requiring an increase in exposure time. The large source beam divergence (or beam pick-up) angle (20°) of the system of the present invention serves to collect a greater quantity of the toroidal irradiation from the light source than typical prior art systems, and the uniformly distributed ring or rings of mirrors (and, hence, the resultant uniformly distributed, multiple apparent sources located in the apparent source plane) serve to split up incident light into portions and to mix or overlay the portions in such a manner as to average out local intensity variations using the light from each apparent source, thereby producing a uniform distribution of light without sacrificing image intensity.

The following table lists certain of the characteristics of various lenses that may be incorporated into the optical imaging system of the present invention.

TABLE 1

| Reference Numeral of Lens | Radius of Curvature (RD) | Thickness (TH) | MEDIUM | Index of Refraction RN | Dispersion Factor DF | Int'l Number |
|---|---|---|---|---|---|---|
| 31 | 8.613383 | 0.514168 | SCHOTT BK7 | 1.530240 | 0.287 | 517635 |
|  | −24.275616 | 6.713517 | AIR |  |  |  |
| 27 | 1.884250 | 0.300000 | SCHOTT UBK7 | 1.530219 | 0.283 | 517635 |
|  | 4.363000 | 3.304802 | AIR |  |  |  |
| 23 | −4.468495 | 0.400000 | SCHOTT UBK7 | 1.530219 | 0.283 | 517635 |
|  | −1.035400 | 2.294218 | AIR |  |  |  |
| 21 | 11.559798 | 0.400000 | 7940 (FUSED QUARTZ) | 1.469610 | −1.293 | Fused Silica |
|  | −2.682280 | 5.100000 | AIR |  |  |  |
| 17 | 5.907477 | 0.400000 | 7940 (FUSED QUARTZ) | 1.469610 | −1.293 | Fused |

TABLE 1-continued

| Reference Numeral of Lens | Radius of Curvature (RD) | Thickness (TH) | MEDIUM | Index of Refraction RN | Dispersion Factor DF | Int'l Number |
|---|---|---|---|---|---|---|
| | −13.968900 | 0.001000 | AIR | | | Silica |
| | 3.200000 | 0.400000 | 7940 (FUSED QUARTZ) | 1.469610 | −1.293 | Fused Silica |
| | 9.019304 | 36.855990 | AIR | | | |

In the above table, Schott represents the manufacturing company Schott Optical Glass Company of Duryea, Pa., U.S.A.

The method of illumination employed in the system of the present invention is the Köhler method as described, for example, in pages 225–228 of Applied Optics and Optical Engineering, Vol. II edited by R. Kingslake and published by Academic Press, New York, 1965.

I claim:

1. An optical imaging system for uniformly distributing light energy onto a selected plane, the system comprising:
   an energy source coaxially disposed along an optical axis of the system;
   a paraboloidal assembly of reflectors having an axis of symmetry coincident with the optical axis of the system and being distributed along a plane orthogonally intersecting the optical axis of the system, the reflectors being distributed with respect to each other in a ring about the energy source for receiving light energy from the energy source and uniformly distributing it as if it originated from multiple apparent energy sources in a common apparent source plane;
   variable focusing lens means disposed along the optical axis of the system for adjusting the divergence angle of the light energy at the selected plane; and
   means disposed along the optical axis of the system for directing light energy from the paraboloidal assembly of reflectors to the variable focusing lens means and from the variable focusing lens means to the selected plane to provide a uniform light energy distribution of multiple apparent energy sources at the selected plane.

2. An optical imaging system as in claim 1 wherein said energy source is a light source, and said multiple apparent energy sources are multiple apparent light sources.

* * * * *